United States Patent [19]

Huellwegen

[11] 3,970,944

[45] July 20, 1976

[54] PULSE SUPPRESSING CIRCUIT ARRANGEMENTS AND EQUIPMENT INCORPORATING THE SAME

[75] Inventor: Josef Huellwegen, Altenbeken, Germany

[73] Assignee: Nixdorf Computer AG, Paderborn, Germany

[22] Filed: Feb. 27, 1975

[21] Appl. No.: 553,587

[30] Foreign Application Priority Data

Mar. 7, 1974 Germany............................ 2410957

[52] U.S. Cl............................. 328/162; 178/69 A; 179/170 E; 307/234; 307/268; 328/164; 328/165

[51] Int. Cl.²....................... H03B 1/04; H03K 5/01; H04B 15/00

[58] Field of Search ........... 307/232, 233, 234, 268; 328/111, 112, 162, 163, 164, 165; 178/69 R, 69 A; 179/170 E

[56] References Cited
UNITED STATES PATENTS

| | | | |
|---|---|---|---|
| 3,328,602 | 6/1967 | Taylor | 307/234 |
| 3,555,434 | 1/1971 | Sheen | 307/234 X |
| 3,676,699 | 7/1972 | Warren | 307/234 |
| 3,796,831 | 3/1974 | Bauer | 307/234 X |

*Primary Examiner*—John Zazworsky
*Attorney, Agent, or Firm*—Woodhams, Blanchard and Flynn

[57] ABSTRACT

A pulse suppression circuit arrangement, suitable for use in a data transmission system, for suppressing, in dependence on the length thereof, noise disturbance or other undesired signal pulses of lengths outside a range of lengths in which useful signal pulses lie wherein a train of output signal pulses, freed of superimposed errors caused by said undesired signal pulses, is obtained by at least one process of coupling incoming signal pulses with generated pulses produced when said incoming signal pulses occur, each such coupling process consisting in coupling incoming signals or signals derived therefrom with the generated pulse output from triggerable pulse generator means triggered by signal pulse edges of one polarity and the time constant of which is less than the useful signal pulse length and greater than undesired signal pulse length and again effecting such coupling under the control of incoming signal edges of the other polarity.

12 Claims, 16 Drawing Figures

PULSE SUPPRESSING CIRCUIT ARRANGEMENTS AND EQUIPMENT INCORPORATING THE SAME

FIELD OF THE INVENTION

This invention relates to pulse suppressing circuit arrangements and equipment incorporating the same and provides circuit arrangements and equipments which are primarily intended for use in data transmission systems. As will be seen later the invention is of great advantage in such systems for suppressing noise and disturbance pulses and thus avoiding the mutilation of useful signals by noise and disturbance pulses.

BACKGROUND OF THE INVENTION

During transmission of electrical signals a variety of disturbances such, for example, as background noise, crackle, spluttering and contact chatter are apt to occur in the transmission path. Usual practice is, in general, to seek to get rid of such disturbances by providing at the receiving end of the transmission path suitable frequency and/or amplitude sensitive analog filter arrangements which attenuate the disturbances so that disturbances of frequencies and/or amplitudes lying outside the frequency and/or amplitude ranges of the desired useful signals are reduced or eliminated. However, in practice very brief but high amplitude disturbances, strong enough to be able to lead to erroneous evaluation of the desired signals still reach the receiving equipment and are not eliminated or sufficiently reduced by the filter arrangements referred to. Moreover, the provision of such filter arrangements in the transmission lines of data transmission installations may be very costly, especially in the case of data transmission systems in which the range of the transmission speeds which must be handled is very large, e.g. between 50 and 10,000 baud. Moreover, integrated analog filters have the defect that while they reduce the amplitudes of disturbances they extend them in time.

It is known to reduce disturbance signals occurring within the useful transmission band width by using them to produce control signals by means of which they are combined in opposition with signals produced when they occur and for the duration of their occurrence, so that the signals which are combined are mutually cancelling. However, this expedient can be usefully applied only for the elimination of disturbance signals which arise during pauses between desired signals. This, of course, is because this expedient of getting rid of disturbances by what is essentially a self cancelling signal method produces gaps in the signals and if such cancellation is effected during the presence of desired signals, information is caused to be lost. If the proportion of information lost in this way exceeds a certain value, the legibility of the desired transmitted signals is reduced so much that the information they contain is no longer utilisable. There therefore still remains the problem of securing adequate elimination of disturbance signals without unacceptable interference with no loss of desired useful signals.

A noise elimination circuit arrangement for binary information signals and which is designed to solve the aforesaid problem within certain limits has already been proposed. This circuit arrangement (which will be found described in German Auslegeschrift DT-AS 2165461) consists of two bistable circuits and a number of NAND gates. Signals containing disturbance components are fed in to the circuit arrangement and there interlinked with signals of a cyclic nature which are obtained from a specially provided generator. The arrangement is such that the desired useful signals, with the disturbance signals removed at least to a large extent, are recovered at the output of the circuit arrangement but are retarded by two complete cycles in relation to the signals fed in. This is a disadvantage. Another disadvantage is the need to provide a generator which produces cyclic signals of a fixed predetermined period which must be such that twice its value must be both greater than the expected duration of a disturbance signal and less than the duration of a desired useful signal. Because of this the said cyclic signal generator must be of high accuracy and precision of design and operation. Furthermore there is the defect that the operation of the circuit arrangement depends on control by outside signals and if these fail to appear elimination of the disturbance signals does not occur. Finally the correct functioning of the circuit arrangement in question is in large measure dependent on the relative position in time of the disturbance signals with respect to the cyclic signals, and when any material deviation from a given relationship in time occurs, the desired useful signals may become distorted.

The present invention seeks to avoid the disadvantages of the various known arrangements above mentioned and to provide improved circuit arrangements of a relatively simple nature which will provide adequately effective suppression of disturbance signals without unacceptable distortion or loss of useful desired signals; which do not involve the provision of any special cyclic signal generator; and which function only when signal changes occur, so that the need for continuous actuation by special signals derived from an outside source is eliminated.

According to the present invention, there is provided a pulse suppression circuit arrangement, suitable for use in a data transmission system, for suppressing, in dependence on the length thereof, noise, disturbance or other undesired signal pulses of lengths outside a range of lengths in which useful signal pulses lie wherein a train of output signal pulses, freed of superimposed errors caused by said undesired signal pulses, is obtained by at least one process of coupling incoming signal pulses with generated pulses produced when said incoming signal pulses occur, each such coupling process consisting in coupling incoming signals or signals derived therefrom with the generated pulse output from triggerable pulse generator means triggered by signal pulse edges of one polarity and the time constant of which is less than the useful signal pulse length and greater than undesired signal pulse length and again effecting such coupling under the control of incoming signal edges of the other polarity.

Preferably the triggerable pulse generator means are of the monostable type. As will be seen, if the generator means of this type is employed a train of input signals (or a train corresponding therewith) is at least once interlinked with the output of a monostable circuit actuated by signal edges of one polarity and having a time constant less than the duration of useful signals and longer than the duration of pulses to be suppressed, a further interlinking, while regulation is effected by signal edges of the other second polarity, being effected.

In this way a function which suppresses the undesired pulses is derived from the respective course of the signal itself by logic interlinking of the signals with reference times. The invention thus lends itself to embodiment in relatively inexpensive apparatus of relatively simple circuitry. The operation is reliable and satisfactory for each undesired pulse is suppressed during its transit time and only during this time. Because a monostable circuit or a similar triggerable circuit of like properties controls this suppression, the useful signals are extended only by the transit time of the monostable circuit or the like and this extension is compensated for by the further interlinking which ensues as a result of actuating by signal pulse edges of opposite polarity to those used in connection with the first interlinking so that compensating pulse shortening of the useful pulses occurs. Thus, the overall result is merely a displacement in time of the useful signals by an amount determined by the time constants of the monostable circuits used. The noise suppression operates entirely asynchronously and independently of externally produced cyclic signals, so that it does not produce additional distortions. The criterion for ensuring the described process is always the appearance of a leading edge of a pulse.

The invention may be advantageously employed in the receiving channels of data signal transmission systems for eliminating noise and disturbance produced as a result of signal amplitude limitation or digitalisation. In signal transmission systems using translators (modulators) the elimination of noise and disturbance can be effected after demodulation.

The invention lends itself not only to embodiment in simple circuitry but also to the use integrated circuit techniques in such circuitry. Thus, for example, embodiments using series inverters parallel fed with a monostable circuit (such embodiments will be described later) with the monostable circuit (unstable state) output and the output of the second inverter fed to the respective inputs of a NAND gate which furnishes a train of output signals which is used for the second interlinking operation, can be constructed from two essentially similar and simple circuit arrangements in series, both of which lend themselves to integrated circuit construction. Similar advantages of simplicity and easy manufacture consequent upon the use of a plurality of essentially simple and similar circuit arrangements to constitute an embodiment apply to other circuit arrangements and equipments embodying the invention and later to be described herein.

As will be seen later the invention may be used to suppress pulses other than noise or disturbance pulses and notably to suppress pulses transmitted at transmission speeds outside a specified speed range. It may therefore be used to provide what may be termed a transmission speed "filter" to secure accurate separation of data signals which are to be transmitted or not transmitted respectively in terms of their transmission speed. For example, during base band transmission the requirement of an upper transmission speed limit in one transmission channel can be easily satisfied. Such a "filter" if incorporated at the transmitting end reliably prevents an increase of transmission speed beyond a predetermined value. As will be seen later the limits of the "pass speed range" of such a "filter" can be made easily and independently adjustable. High speed pass "filters," low speed pass "filters" and band speed pass "filters" (to use terms analogous to high pass, low pass and band pass filters) are all easily obtainable in accordance with specified requirements.

BRIEF DESCRIPTION OF THE DRAWINGS

The invention is illustrated in and further explained in connection with the accompanying drawings in which.

DETAILED DESCRIPTION

Figure 1:
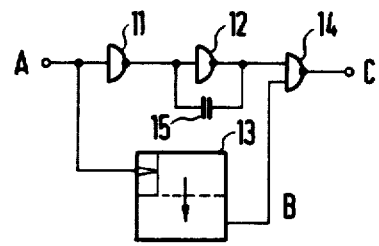
FIG. 1 illustrates the invention in principle.

FIG. 1 which, as stated above, illustrates the principle of the invention is the basic circuit diagram of a single stage for securing suppression of a disturbance pulse lying within a given region. This basic circuit includes two inverting stages 11 and 12, a monostable circuit 13 and a NAND gate 14. The two inverting stages 11 and 12 are connected in series. Signals received at the input A of the circuit are supplied to the first inverting stage 11 and to the monostable circuit 13. The output B from the monostable circuit 13 together with the output from the second inverting stage 12 are led to the NAND gate 14, the output terminal of which is the output terminal C of the whole circuit. A small capacitance 15 is connected in parallel with the inverting stage 12. Its purpose is to prolong the transit time of the inverting stages 11 and 12 which are intrinsically shorter than the transit time of the monostable circuit 13, and thus to adapt the inverting stages to the monostable circuit.

Figure 2:
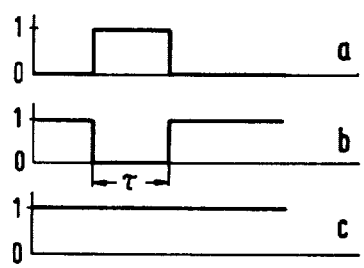
FIG. 2 is a graphical figure explanatory of the operation of FIG. 1.

In FIG. 2 the signals which appear at the points A, B and C shown in FIG. 1 are conventionally represented at a, b and c respectively. The operation to suppress a disturbance pulse of length equal to or shorter than the time constant T of the monostable circuit 13 will now be described.

When such a disturbance pulse appears at A it is inverted twice by the inverting stages 11 and 12, and is fed in to one input of the NAND gate 14. If the pulse is of logic state 1 at A, it will appear with the same state at the input of the NAND gate 14 but delayed by the transit time of the two inverting states 11 and 12. This pulse is represented at a of FIG. 2. The input pulse applied at A triggers the monostable circuit 13 into its unstable state, from which, after the elapsing of its time constant T, it returns to the stable state. FIG. 2 shows at *b* the signal appearing at the output B of the monostable circuit 13. During the above described actions the logic state 1 is maintained at the output C of the NAND gate 14 as shown by *c* of FIG. 2, because at no time are the inputs to the said gate 14 such as can change over the logic state at C to the state 0.

The circuit arrangement of FIG. 1 thus suppresses the disturbance pulse by combining it with a pulse which is produced by means of a time element device (the monostable circuit 13) by the said disturbance pulse itself. The invention uses this principle with great advantage for the elimination of disturbances occurring on data signals during the transmission of the data. Such disturbances, if not eliminated, could, for example, cause such gaps in a train of useful signals as to cause a useful signal of relatively long duration to appear at a receiver as two signals of shorter duration. The elimination of such disturbances without adversely affecting the length of the individual useful signals will now be described with reference to FIGS. 3 and 4.

Figure 3:
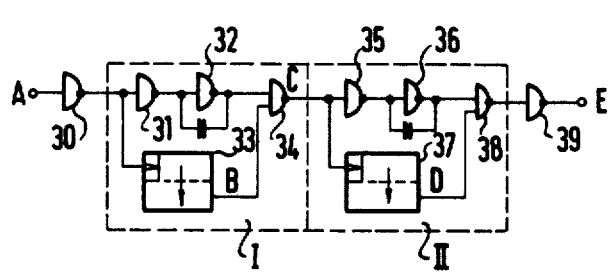
FIG. 3 shows a circuit arrangement in accordance with the invention for suppressing disturbance pulses of one polarity.

FIG. 3 shows an embodiment consisting of two circuits I and II each as illustrated by FIG. 1, in series and preceded by an additional inverter 30, the input terminal of which constitutes the input terminal A of the whole circuit arrangement. The parts 31, 32, 33 and 34 in circuit I correspond respectively with the parts 11, 12, 13 and 14 in FIG. 1, as do the parts 35, 36, 37 and 38 of circuit II. The capacitances across the inverters 32 and 36 are not referenced but correspond with the capacitance 15 of FIG. 1. In addition there is another inverter 39 between the output of the NAND gate 38 and the output terminal E of the whole arrangement. The operation of the embodiment shown in FIG. 3 to suppress a disturbance which would otherwise produce a gap in a useful signal element will now be described with reference to FIG. 4 in which *a*, *b*, *c*, *d* and *e* show respectively the signals occurring at the points A, B, C, D and E in FIG. 3.

Figure 4:
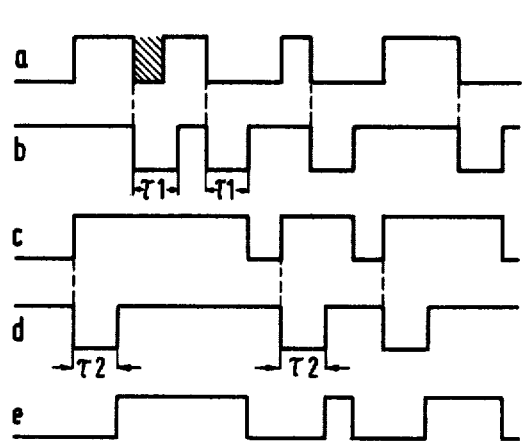
FIG. 4 is a graphical figure explanatory of the operation of FIG. 3.

The useful input at A in FIG. 3 consists of three pulses of different lengths and of the logic state 1. As shown at *a* in FIG. 4 the first of these pulses has a gap which is shown shaded and is assumed to have been the effect of a disturbance occurring during data transmission. The object is to eliminate this gap so that the original useful signal train is restored. FIG. 4 shows at *e* the result of the operation of FIG. 3 and which appears at the terminal E. As will be seen it consists of three pulses corresponding with those shown at *a* in FIG. 4 but without the gap indicated by shading.

The inverting stage 30 inverts the series of input pulses, so that positively going pulse edges at A become negative going edges at the inputs of the monostable circuit 33 and the inverter 31. After two more inversions by the inverters 31 and 32 there appear at one input of the NAND gate 34 negative going pulse edges for the positive going pulse edges at A. The monostable circuit 33 is arranged by known means (not shown) so that it can be triggered into its unstable state only by positively going pulse edges. Therefore the first triggering of the monostable circuit 33 occurs as shown at *b* in FIG. 4 when the first negative going edge appears at A — that is to say, when the negative going leading edge of the gap shown shaded in FIG. 4 appears. The monostable circuit 33 has a time constant T1, and after the lapse of this time the original stable state is restored, as shown at *b* in FIG. 4. The next negative going pulse edge to appear at A is the regular end of the first useful pulse, and when this appears the monostable circuit 33 is again triggered into its unstable state, returning to its stable state after a further time T1. A similar action occurs for the negative going edges of the short data pulse (the second signal pulse) and of the following longer data pulse (the third signal pulse).

The output of the NAND gate 34 is shown at *c* in FIG. 4. The inputs of the NAND gate 34 are fed with the respective outputs of 32 and 33, and the logic state 1 can appear at C only when there is the logic state 0 at one of the inputs of said NAND gate. When both its inputs are in the logic state 1, the logic state 0 appears at the output C of the NAND gate 34. As will be seen the output at C differs from the input at *a* in two respects, namely, that the shaded gap is gone and the pulses (now without any gap) are prolonged by the time constant T1 of the monostable circuit 33. The pulses have to be restored to their correct original lengths and this is done, as will now be described, by delaying their leading edges by the amount T1. This is done by circuit II. The train of signals appearing at C is fed through the inverters 35 and 36 to one input of the NAND gate 38 and also to the input of the circuit 37 the output of which is fed to the second input of said NAND gate 38. The output from this gate 38 is inverted by the further inverter 39 to produce at E the restored correct useful signal train shown at *e* in FIG. 4.

For exactly correct restoration of the useful signal train the time constant of the monostable circuit 37 in circuit II must be exactly the same as the time constant of the monostable circuit 33 in circuit I — i.e., it must also be T1. In practice, however, exact equality is not necessary and, in most cases at any rate, small departures from exact equality can be tolerated. The difference between the actions of the second circuit II from those of the first circuit I arises from the fact that the signals appearing at the circuit point C are fed without inversion to the inverter 35 and the monostable circuit 37. As a result each positive going signal edge at C triggers the monostable circuit 37 to its unstable state. It will accordingly be apparent, from the description already given, how the outputs at D and E and as shown at *d* and *e* of FIG. 4 respectively, are obtained. It will be noted (see line *d* of FIG. 4) that the correct restored pulse train has been delayed by the time T2 (= T1) but this is generally immaterial in data transmission.

The circuit illustrated in FIG. 3 will eliminate disturbances which produce gaps in the useful signal elements. However there are disturbances which can arise during data transmission and which will produce pulses in intervals between useful signal elements. It may therefore be necessary to suppress disturbances which cause such additional pulses as well as those which produce gaps. The result can be achieved by providing an arrangement which operates as described with reference to FIGS. 3 and 4 and an arrangement which operates in the same way on an inverted train of signals. Thus, four series circuits like the circuits I and II of FIG. 3 could be used, the output signal obtained from the first two in series being inverted and applied to the remaining series circuits of two basic circuits.

Figure 5:
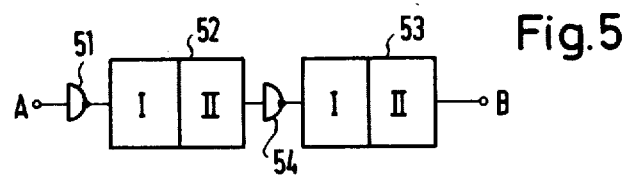
FIG. 5 is a block diagram of an embodiment of the invention for suppressing pulses of both polarities.
Figure 6:
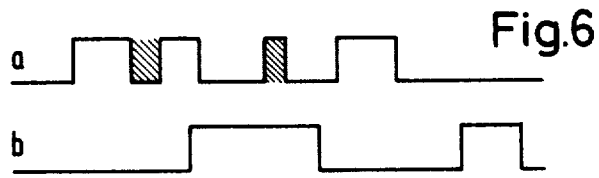
FIG. 6 is a graphical figure explanatory of the operation of FIG. 5.

FIG. 5 is a block diagram of such an arrangement. Between the input A and the final output B there is, in series, an inverter 51, a first pair of series circuits I and II (as in FIG. 3), this pair being referenced 52, an inverter 54 and a second pair of series circuits I and II (also as in FIG. 3) this second pair being referenced 53. FIG. 6 shows at *a* the input pulse train at A and, at *b* the corrected disturbance-freed signal train which appears at B. In these figures it is assumed that the useful pulse train consists of a longer pulse followed, after an interval by a shorter pulse. It is also assumed, as shown at $a$, that the longer pulse has been distorted by a disturbance producing a gap (shown shaded) while, in the interval between the two pulses, disturbance has produced an additional pulse (also shown shaded). As will be seen, the corrected output pulses are delayed by a time equal to the sum of the time constants (delays) produced by 52 and 53. The inverter 51 in FIG. 5 corresponds with the inverter 30 in FIG. 3. The output signal from the NAND gate (not shown separately) included in the circuit II of the pair 52 is inverted by the inverter 54, which corresponds with inverter 39 in FIG. 3. Since, as regards the second pair 53, there is no inverter corresponding with the inverter 30 of FIG. 3 the final result, as shown at $b$ in FIG. 6, is that which is required.

The circuit shown in FIG. 5 has the advantage that it will get rid of disturbances of both polarities irrespective of whether the positive ones are longer or shorter than the negative ones. If, on an average, the positive and negative disturbances are of different time durations the circuits I and II in 52 should be dimensioned for a suppression time (time constant of the monostable circuit) to suit disturbances of one polarity and the circuits I and II in 53 should be dimensioned to present a time constant to suit disturbances of the other polarity.

Figure 7:
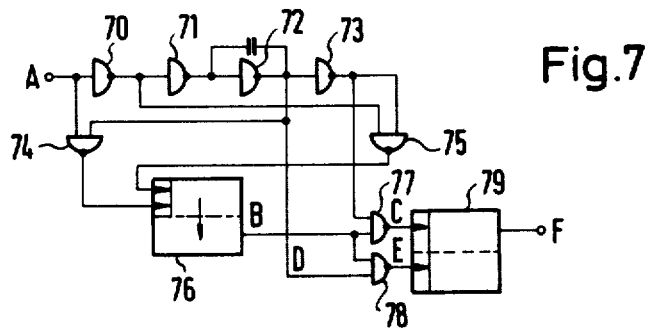
FIG. 7 shows a further circuit arrangement in accordance with the invention for suppressing disturbance pulses of both polarities and of substantially equal lengths.
Figure 8:
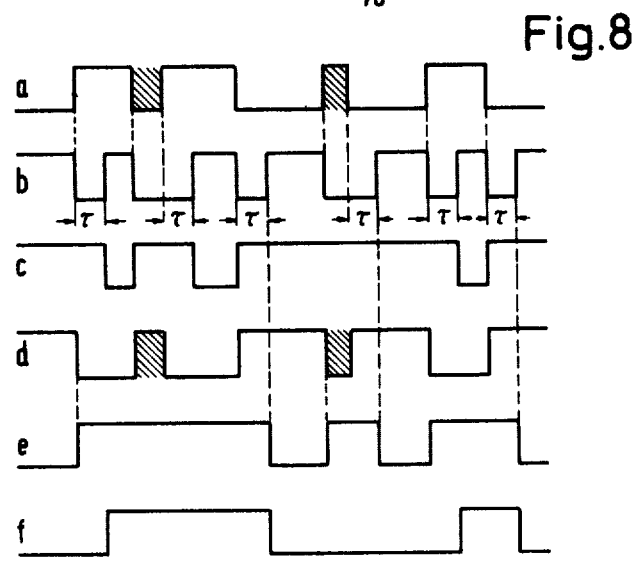
FIG. 8 is a graphical figure explanatory of the operation of FIG. 7.

It is possible to determine, during data transmission, how often particular noise pulse polarities occur as a function of frequency, and it has been found that, in general, the number of positive and negative disturbance pulses of given frequency are approximately equal. Advantage may be taken of this fact to provide a circuit arrangement of considerably reduced circuit complexity and therefore considerably cheaper than that of FIG. 5, and which will nevertheless operate successfully to get rid of disturbances of both polarities. FIG. 7 illustrates such a simplified circuit arrangement, while FIG. 8 shows the associated signal trains.

The embodiment shown in FIG. 7 is suitable for suppressing disturbances of different polarities but whose duration are, on average, the same. In order to suppress such disturbances there is required only one time element which produces a time constant T for both types of disturbance. Referring to FIG. 7 there is a retriggerable monostable circuit 76. There are four inverters 70, 71, 72 and 73 connected in series, four NAND gates 74, 75, 77 and 78 and a bistable circuit 79. A capacitance is connected across the inverter 72. The input wave train is applied at A; to one input of gate 74 directly; and via inverters 70, 71, 72 and 73 to one input of each of the gates 75 and 77. The output from inverter 70 is applied to the remaining input of gate 75 and the output from inverter 72 is applied to the remaining input of gate 74 and to one input of gate 78. The inputs of the retriggerable monostable 76 are fed one with output from gate 74 and the other with output from gate 75. The output of said retriggerable monostable is fed into the remaining input of gate 77 and the remaining input of gate 78. The outputs from these gates 77 and 78 are fed one to one and the other to the other, of the two inputs of the bistable 79. A disturbance freed output appears at the output F of the bistable 79, delayed by the time constant T of the retriggerable monostable circuit 76. The wave forms appearing at points A, B, C, D, E and F of FIG. 7 are represented at $a$, $b$, $c$, $d$, $e$ and $f$ respectively of FIG. 8.

The functioning of the circuit of FIG. 7 will now be described with reference to FIG. 8. The input train at A, shown at $a$ in FIG. 8, consists of a longer useful pulse followed after an interval by a shorter useful pulse. The longer pulse is shown as having a disturbance produced gap (shown shaded) in it while an added, disturbance produced gap is shown as present in the interval between the two useful pulses. This is also indicated by shading.

A negative going pulse is produced at the output of the NAND gate 74 or 75 respectively for all positive going or negative going edges appearing at A, the length of the pulse equalling the very short transit time of the three inverting states 70, 71 and 72 because one of the control inputs of the respective NAND gate has the logic state 1 during this transit time and has the logic state assigned to it after this transit time. Since these negative pulses are fed to the control inputs of the monostable circuit 76, the said circuit in each case produces a signal of logic state 0 at its output B, this signal being of duration equal to the time constant T. Line $b$ of FIG. 8 shows the output from 76. It is assumed that the disturbances are of duration less than or at most equal to the time constant T. If now an interval of this short magnitude is present between two triggering pulses generated by the edges of a disturbance pulse for the monostable circuit 76, the said monostable circuit 76 which is triggered to its unstable state by the first triggering pulse remains in the unstable state because it receives the second triggering pulse before expiry of the time T from the instant of application of the first triggering pulse and retains the unstable state for a time T after the application of the second triggering pulse. Thus every disturbance in the train applied at A ($a$ of FIG. 8) produces a logic state of equal duration in the signal train appearing at B. Since NAND gates 77 and 78 receive each one input from the output of the monostable circuit 76 and one receives the input train in its original polarity state while the other receives the input train inverted, the wave forms shown in FIG. 8 at $c$ and $e$ respectively appear at the outputs of gates 77 and 78. The bistable circuit 79 is triggered by the pulse trains at C and E and is switched by the alternately appearing negative edges of the two pulse trains to provide at F an output train as shown at $f$ in FIG. 8. This output is free of disturbances, and is a corrected signal train. It is delayed in time by the time constant T of the monostable circuit 76.

Figure 9:
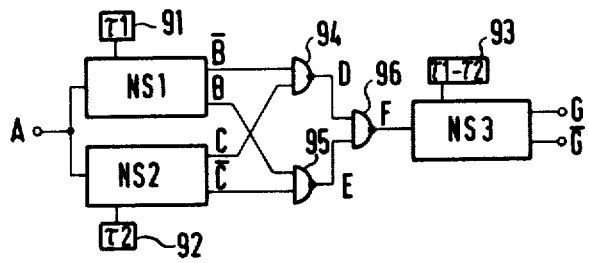
FIG. 9 shows a further embodiment of the invention.

Since with this invention, the suppression of undesired pulses is dependent on the relation between their length and the time constant of the time element employed (the monostable circuit) it is possible to use the invention to effect limitation of the speed of transmission of signals during their transmission. If limitation is imposed in such a manner that a maximum value is not exceeded and a minimum limiting value is also applied it is possible to produce a result like that of a filter which passes signals which are within a given range of transmission speeds. FIG. 9 shows schematically an embodiment of this invention capable of acting in this way. It consists of an assembly of circuits forming such a band or time filter.

In FIG. 9 there are three circuit arrangements NS1, NS2 and NS3, each of which is as described with reference to FIG. 5 or as described with reference to FIG. 7. However, these circuit arrangements NS1, NS2 and NS3 differ from one another by the time constant of the monostable circuits included therein. To enable this to be more conveniently achieved adjustment means represented by the blocks 91, 92, 93 are provided for enabling individual adjustment of the time constants to be obtained. These time adjustment means are not shown or described in detail herein since they may take any form known per se - for example they may comprise resistance-capacity time constant adjusting circuits. Thus, for example, the adjustment circuit 91 may be adjusted for a time constant T1 chosen at a suitable value to furnish a lower limit for the speed of the pulses to be passed by the whole arrangement and adjustment circuit 92 may be adjusted for a time constant T2 chosen at a suitable value to furnish an upper speed limit. The adjustment circuit 93 is adjusted to provide NS3 with a time constant equal to the difference T1 - T2 between the two time constants T1 and T2, T2 being, of course, smaller than T1. The circuit arrangements NS1, NS2 and NS3 are inter-connected by NAND gates 94, 95 and 96 for a purpose which is yet to be described and each has an inverted and a non inverted output. The way in which the apparatus of FIG. 9 operates will now be described with the aid of the diagrams in FIGS. 10, 11 and 12, which respectively explain what happens in the cases of a transmission speed lying within the chosen transmission region, above said transmission region and below said region.

Figure 10:
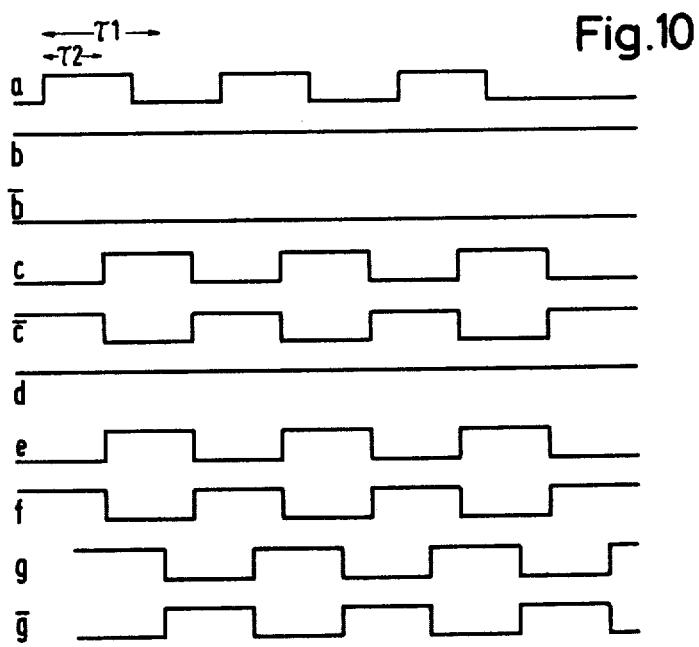
FIGS. 10, 11 and 12 are graphical figures explanatory of the operation of FIG. 9 with different inputs.
Figure 11:
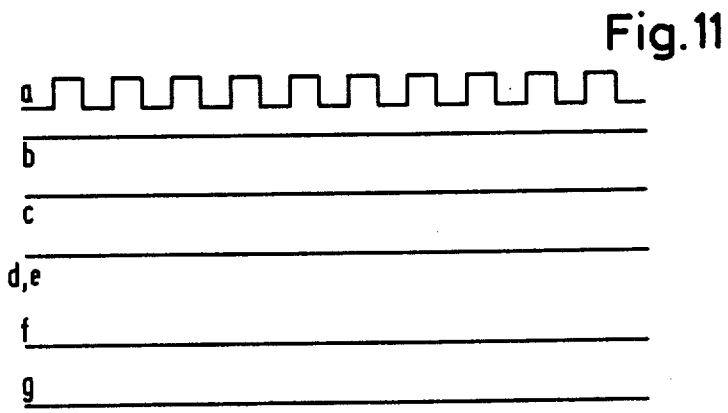
Figure 12:
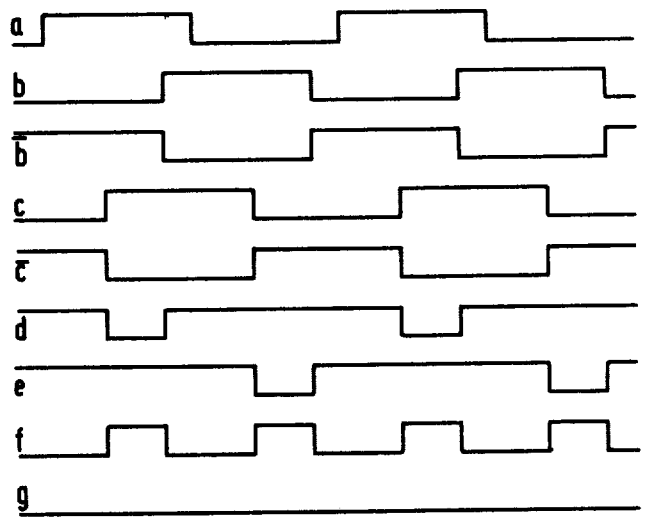

The pulse trains indicated by the lower case reference letters in FIGS. 10, 11 and 12 are those which appear at the points indicated in FIG. 9 by the same capital letters. The input at point A (a of FIG. 10) consists of a series of pulses of such length as to be within the range T1 - T2, determined by the adjusted time constants T1 and T2. Due to the way in which the pulse suppression circuits NS1, NS2, NS3 function there will be no signal in pulse form at the two outputs B and $\overline{B}$ of the pulse suppression circuit NS1 but, instead, merely a continuous logic state of 1 or 0 respectively, because the pulses fed in at A are shorter than the time constant T1. On the other hand, because the length of the pulses fed in at A is greater than the time constant T2 of the pulse suppression circuit NS2, there will appear at the outputs C and $\overline{C}$ of the pulse suppression circuit NS2, mutually inverted pulses which are delayed by the time constant T2 relative to the pulses fed in at A.

Because NAND gate 94 has one input connected to $\overline{B}$ and the other to C while NAND gate 95 has one input connected to B and the other to $\overline{C}$ pulse trains as shown at d and e of FIG. 10 will appear at the gate outputs D and E. Because a NAND gate always has its output in the logic state 1 when at least one of its inputs is in the logic state 0 a continuous logic state 1 appears at the output D, while at the output E there appears a pulse train which corresponds with the inverted pulse train appearing at C. The outputs of the two gates 94 and 95 are connected to the inputs of a further NAND gate 96 and there therefore appears, at the output F of the gate 96, a signal which is as shown at f of FIG. 10 and which is an inversion of the signal shown at e. This is applied to the pulse suppression circuit NS3 which produces at its outputs G and $\overline{G}$ signals as shown at g and $\overline{g}$ in FIG. 10, delayed, however, with reference to the signal at F by the time constant T1 - T2.

Now suppose the pulses fed in at A are shorter than the time constant T2. FIG. 11 explains what happens in this case. Because the pulse length is shorter than T2 and, therefore, also shorter than T1, the incoming signal pulses are suppressed by the pulse suppression circuits NS1 and NS2, and continuous logic states 1 and 0 appear at their outputs B and $\overline{B}$ and C and $\overline{C}$, respectively and as indicated at b and c in FIG. 11 which shows merely the states at the outputs B and C respectively. Accordingly a continuous logic state 1 appears at the outputs D and E of the two NAND gates 94 and 95, as indicated by the line d, e of FIG. 11. There is, therefore, a continuous logic state 0 at the output F of NAND gate 96 and no pulsed output signal appears at either output terminal of NS3.

FIG. 12 explains what happens when the incoming pulses have a length which is greater than the time constant T1 i.e. when the input signals have a transmission speed below the lower limiting speed set by the adjusted value of the time constant T1. Because the time constant T1 is shorter than the incoming pulse length, signals as shown at b and $\overline{b}$ of FIG. 12 appear respectively at B and $\overline{B}$ of the pulse suppression circuit NS1. These are mutually inverted signals and are delayed, relatively to the incoming pulses (a of FIG. 12) by the time constant T1. Since the pulse length is also greater than the time constant T2, signals as shown at c and $\overline{c}$ appear at the outputs C and $\overline{C}$ respectively of the pulse suppression circuit NS2. These are also mutually inverted signals and are delayed relative to the input signals at A by the time constant T2. Signals as indicated at d and e accordingly appear at the output D and E respectively of the NAND gates 94 and 95. The pulse length in these signals is equal to the difference T1 - T2 between the two time constants. The signal at the output F of the NAND gate 96 is as shown at f and consists of pulses which are all of the same length T1 - T2. Since the time constant of the pulse suppression circuit NS3 is adjusted to this value T1 - T2 it suppresses these pulses and no pulsed output appears from NS3.

As will now be appreciated, for FIG. 9 to work in the required manner the time constant of the pulse suppression circuit NS3 must be adjusted to the difference T1 - T2. As a result, the speed pass range of the circuit shown in FIG. 9 is limited, because, in order to avoid the suppression of desired signals within the range, the value of the difference T1 - T2 must not exceed the shorter time constant T2. Thus, the speed pass range cannot exceed the shorter of the two time constants T2.

Figure 13:
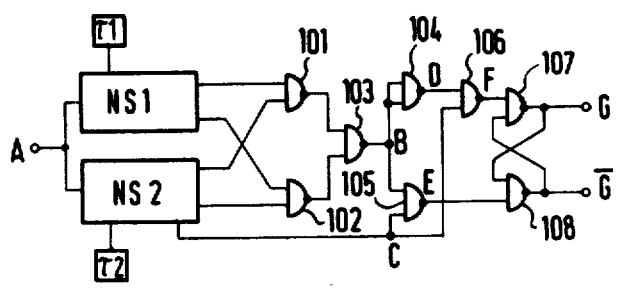
FIG. 13 shows an improvement on the arrangement of FIG. 9.
Figure 14:
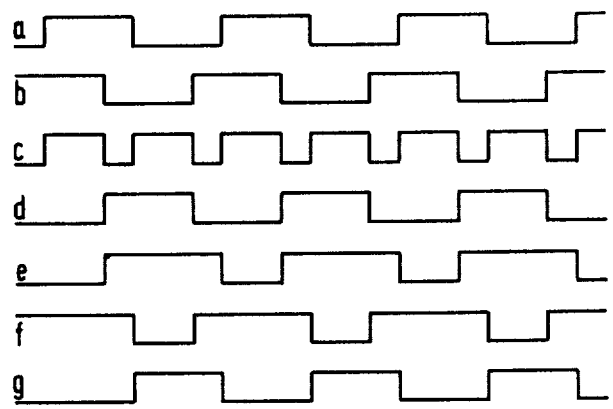
FIGS. 14, 15 and 16 are explanatory graphical figures explanatory of the operation of FIG. 13 with different inputs.
Figure 15:
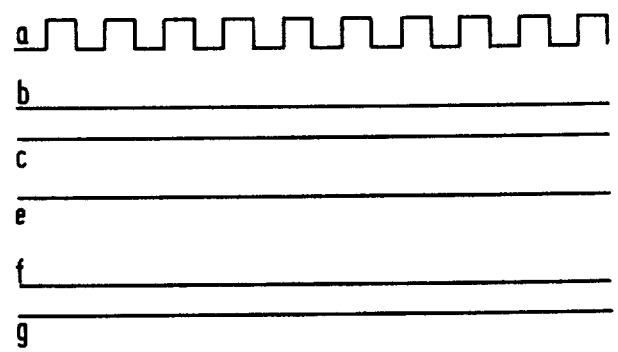
Figure 16:
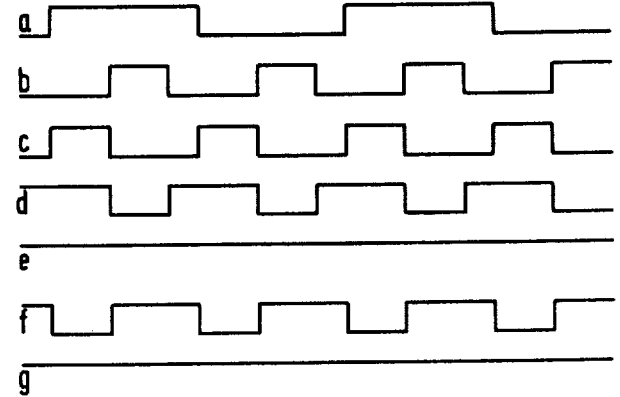

FIG. 13 shows an embodiment by which this limitation is avoided. The explanation of how it works will be given, with reference to FIGS. 14, 15 and 16 the relation of which, to FIG. 13, is similar to the relation of FIGS. 10, 11 and 12 to FIG. 9. With FIG. 13 it is possible to adjust to a pass range because there is no pulse suppression circuit for suppressing pulses of length T1 - T2. In FIG. 13 there are only two pulse suppression circuits the former of which is adjusted to have a time constant T1 and the latter of which is adjusted to have a time constant T2. The outputs of these circuits NS1 and NS2 are connected to the inputs of NAND gates 101 and 102 in the same manner as that in which NS1 and NS2 in FIG. 9 are connected to the gates 94 and 95. The outputs of gates 101 and 102 are connected, one to one and the other to the other, to the two inputs of a NAND gate 103 the output of which is connected to both inputs of a NAND gate 104 and also to one input of a NAND gate 105 which serve to control a flip-flop circuit constituted by two NAND gates 107 and 108, a further NAND gate 106 (one input of which is fed from the output D of gate 104) being interposed between the NAND gate 104 and the NAND gate 107. The only points in FIG. 13 for which signals are shown in FIGS. 14, 15 and 16 are the points A to G. Since the two pulse suppression circuits NS1 and NS2 (with their time constant adjusting circuits T1 and T2) operating in conjunction with the NAND gates 101 to 103 are similar to the corresponding parts of FIG. 9 and their operation is similar, it has not been thought necessary to illustrate in FIGS. 14, 15 and 16 the signals appearing in this portion of the circuitry. In FIG. 13 the circuit point C is one at which the output of the monostable circuit in the pulse suppression circuit NS2 appears when said monostable is in its unstable state. This point C is connected to the remaining input of NAND gate 105 and to the remaining input of NAND gate 106.

FIGS. 14, 15 and 16 are explanatory, respectively, of the operation which occurs when the incoming signals are within the transmission region, above said region or below said region of the circuit arrangement shown in FIG. 13. FIG. 14 shows at $a$ incoming pulses the length of which is between T1 and T2. At the point B there appear pulses as shown at $b$ in FIG. 14 and which correspond with the input pulses at A inverted and time displaced with respect thereto by the time constant T2 of the pulse suppression circuit NS2. In line $c$ of FIG. 14 are shown the pulses which appear at C from the monostable circuit in the pulse suppression circuit NS2 when said monostable circuit is in the unstable state. These pulses are of length T2 and each has a leading edge which coincides with the leading edge of an input pulse. The NAND gate 105 receives these pulses as does the NAND gate 106. Both inputs of NAND gate 104 receive the signals appearing at the point B. As will be apparent the signals appearing at the outputs D and E of the gates 104 and 105 will be as shown at $d$ and $e$. The signals at $d$ are fed to the remaining input of gate 106 while those at $e$ are fed to the one input of the flip-flop circuit constituted by the NAND gates 107 and 108. The second input of this flip-flop circuit receives the output, shown at $f$ in FIG. 14 of the NAND gate 106. It will readily be seen that the flip-flop circuit output will be as shown at $g$ in FIG. 14 because the edges of the pulses at E and F alternately switch it over from one state to the other and back again. The output signal at G is a reproduction of the input signal fed in at A. A similar but inverted output (not represented in FIG. 14) is available at $\overline{G}$.

FIG. 15 explains what happens when the incoming pulses at A are of such length as to correspond with a speed above that which corresponds with the time constant T2. These pulses are suppressed by the pulse suppression circuit NS2, so that, as shown at $b$ in FIG. 15, a continuous logic state 0 appears at the point B. A continuous logic state 1 (see $c$ of FIG. 15) appears at C because the high pulse speed prevents the monostable circuit NS2 returning to the stable state. The point F has a continuous logic state 0 (see $f$ of FIG. 15) because the NAND gate 106 is held in the "gate open" condition with like states at both its inputs. The point E has the continuous logic state 1 because the NAND element 105 has different logic input states. At the output point G there appears the continuous logic state 1 and at the output point $\overline{G}$ appears a continuous logic state 0 (not shown in FIG. 16).

Finally FIG. 16 shows the case where the input pulses, as shown at $a$ in FIG. 16, have a speed less than that specified by the time constant T1. The pulses appearing at B are as shown at $b$ in FIG. 16 and are of a length T1 - T2. These pulses, after inversion, together with the pulses at C are received by the NAND gate 106 at the output point F at which appears a pulse series as represented at $f$ in FIG. 16. Point E has a continuous logic state 1, because the two input signals to the NAND gate 105 (see $b$ and $c$ of FIG. 16) are always in such relation as to produce the logic state 1 at F. Accordingly the bistable circuit comprising the NAND gates 107 and 108 produces, at its output point G, a continuous logic state 1 (see $g$ of FIG. 16) and at its output point $\overline{G}$ a continuous logic state 0 (not represented in FIG. 16).

In FIG. 13 the need for a third pulse suppression circuit is avoided because of the feeding of the pulses of the monostable circuit (see FIG. 7) in the pulse suppression circuit NS2 to the two NAND gates 105 and 106 and in this way pulses of length T1 - T2 are suppressed without the need for a third, separate, pulse suppression circuit such as NS3 of FIG. 9. Accordingly the values of T1 and T2 can be chosen or adjusted as desired thus avoiding the limitation of choice which has already been described as present with FIG. 9.

What is claimed is:

1. In a pulse suppression circuit arrangement for use in a data transmission system for suppressing undesired signal pulses having a duration sufficient to interrupt a desired signal pulse transmission, which desired signal transmission has a duration at least equal to a first time interval, said pulse suppression circuit having an input terminal and an output terminal, said desired and undesired signals being applied to said input terminal, the improvement comprising:

triggerable pulse generator means for producing a first signal in response to pulse edges of one polarity of said desired signal, said triggerable pulse generator means having a time constant characteristic wherein the interval of time of said time constant is less than the pulse width of each of said desired signal pulses and greater than the pulse width of each of said undesired signal pulses;

coupling means for producing a second signal opposite in polarity to said first signal in response to signals applied to said input;

gate means responsive to said first and second signals for producing third signal pulses; and signal converter means for converting said third signal pulses to fourth signal pulses identical to said desired signal pulses applied to said input terminal and free of undesired signal pulses mixed therein.

2. An arrangement as claimed in claim 1, wherein said triggerable pulse generator means is a monostable circuit.

3. An arrangement as claimed in claim 2, wherein said coupling means comprises two inverter circuit connected in series and to said triggerable generator means, wherein said gate means includes a NAND gate, the output of the second one of said inverter circuits and of said triggerable pulse generator means being connected to the respective inputs of said NAND gate, the output from said NAND gate defining said third signal pulses.

4. An arrangement as claimed in claim 3, wherein said signal converter means comprises a second monostable circuit, two series connected inverter circuits and a NAND gate connected to the output of the second one of said inverter circuits, and a NAND gate connected to the output of the second one of said inverter circuits, a further inverter circuit being connected between said gate means and said signal converter means and an additional inverter circuit being connected to the output from said signal converter means, the output signal from said additional inverter circuit defining said fourth signal pulses.

5. An arrangement as claimed in claim 4, wherein said first mentioned and said second monostable circuits are triggered in response to different pulse edges.

6. An arrangement as claimed in claim 5, including an inverter circuit connected to said input terminal of said arrangement.

7. An arrangement as claimed in claim 1, wherein said triggerable pulse generator means includes a retriggerable monostable circuit having two triggerable inputs, one of which is triggerable by positive signal pulse edges and the other of which is triggerable by negative signal pulse edges, wherein said signal converter means includes a bistable circuit having two control input terminals, a pair of NAND gates each connected to one of said control input terminals, the signal output of said retriggerable monostable output being coupled to one NAND gate with signals corresponding with said third signal pulses and to another NAND gate with signals corresponding with said third signal pulses inverted, the outputs of the two said NAND gates being fed in to the respective control input terminals of said bistable circuit.

8. An arrangement as claimed in claim 7, wherein one triggering input of said retriggerable monostable circuit is triggered by the output of a two input terminal NAND gate having one input terminal fed with said desired signal pulses and the other input terminal fed with said signals from said coupling means including four series connected inverter circuits, said other input terminal being fed said desired signal pulses inverted three times, while the other trigger input is triggered by the output from a second two input terminal NAND gate having one input fed with said desired signal pulses after one inversion and the other input fed with said desired signal pulses after four inversions.

9. An arrangement as claimed in claim 1, including an additional identical arrangement connected to said input terminal of said first defined arrangement;
wherein said triggerable pulse generator means in each of said arrangements include monostable circuits and adjusting means for adjusting the time constant of said monostable circuits for controlling the range of pulses to be passed; and
wherein one arrangement has a monostable circuit of a first time constant corresponding with the lower limit of the range and the other arrangement has a monostable circuit with a second time constant corresponding with the upper limit of the range and provide respectively an inverted and a non-inverted output, the inverted output of the one arrangement and the non-inverted output of the other arrangement providing inputs for respective first and second NAND gates the outputs from which are used as the respective inputs of a third NAND gate, there being provided a third additional identical arrangement connected to the output circuit of said third NAND gate and having a time constant equal to the difference between the first and second time constants.

10. An arrangement as claimed in claim 1, including an additional identical arrangement connected to said input terminal of said first defined arrangement;
wherein said triggerable pulse generator means in each of said arrangements include monostable circuits and adjusting means for adjusting the time constant of said monostable circuits for controlling the range of pulses to be passed; and
wherein one arrangement has a monostable circuit of a first time constant corresponding with the lower limit of the range and the other arrangement has a monostable circuit with a second time constant corresponding with the upper limit of the range and provide respectively an inverted and a non-inverted output, the inverted output of the one arrangement, and the non-inverted output of the other arrangement providing inputs for respective first and second NAND gates the outputs from which are used as the respective inputs of a third NAND gate, there being also provided a bistable circuit having one control input fed with output from one NAND gate, having one input fed with inverted output from the third NAND gate and the other fed with pulses from the monostable of the second time constant, the second control input of said bistable circuit being fed with output from another NAND gate having one input fed with output from said third NAND gate and the other fed with pulses from the monostable of the second time constant.

11. An arrangement according to claim 5, wherein each of said first mentioned and said second monostable circuits include adjusting means for adjusting the time constant for controlling the pulses to be passed.

12. An arrangement according to claim 1, wherein said fourth signals are delayed from said desired signals applied at said input by an amount equal to said time constant.

* * * * *